(12) United States Patent
Hosoi

(10) Patent No.: US 6,170,690 B1
(45) Date of Patent: Jan. 9, 2001

(54) AIR-TIGHTLY SEALABLE CONTAINER WITH BELL JAR COVERING

(75) Inventor: Masato Hosoi, Niigata-ken (JP)

(73) Assignees: Shin-Etsu Polymer Co., Ltd.; Shin-Etsu Handotai Co., Ltd., both of Tokyo (JP)

( * ) Notice: Under 35 U.S.C. 154(b), the term of this patent shall be extended for 0 days.

(21) Appl. No.: 09/311,636

(22) Filed: May 14, 1999

Related U.S. Application Data

(63) Continuation-in-part of application No. 09/069,327, filed on Apr. 29, 1998.

(30) Foreign Application Priority Data

May 9, 1997 (JP) .................................................... 9-119820

(51) Int. Cl.⁷ .................................................. B65D 53/00
(52) U.S. Cl. ....................... 220/238; 220/235; 215/359; 215/360; 206/445; 206/454; 206/711
(58) Field of Search .................................... 220/235, 236, 220/238, 553, 555; 215/358, 359, 360, 361, 6; 206/445, 454, 455, 456, 561, 711

(56) References Cited

U.S. PATENT DOCUMENTS

| 304,312 | * | 9/1884 | Guptill ................................. 215/359 |
| 323,636 | * | 8/1885 | Comly ................................. 215/359 |
| 326,641 | * | 9/1885 | Guptill ................................. 215/359 |
| 595,189 | | 12/1897 | Mern . |
| 701,117 | * | 5/1902 | Wintherlich ........................ 215/359 |
| 2,064,569 | | 12/1936 | Santucci . |
| 2,462,445 | | 2/1949 | Weiss . |
| 2,753,074 | | 7/1956 | Schmid . |
| 2,800,242 | | 7/1957 | Sauthoff . |
| 2,952,526 | | 9/1960 | Carlson et al. . |
| 3,052,345 | | 9/1962 | Sambursky . |
| 3,071,316 | | 1/1963 | Piemonte et al. . |
| 3,087,641 | | 4/1963 | Millard . |
| 3,326,404 | | 6/1967 | Gardner . |
| 4,129,211 | * | 12/1978 | Clement et al. ................. 206/445 X |
| 4,817,799 | * | 4/1989 | Gregerson et al. .................. 206/445 |
| 5,749,467 | * | 5/1998 | Gregerson ........................... 206/445 |

FOREIGN PATENT DOCUMENTS

| 876342 | 5/1953 | (DE) . |
| 3804986 | 8/1989 | (DE) . |
| 0070266 | 1/1983 | (EP) . |

* cited by examiner

*Primary Examiner*—Stephen K. Cronin
(74) *Attorney, Agent, or Firm*—Wenderoth, Lind & Ponack, L.L.P.

(57) ABSTRACT

Provided by the invention is an air-tightly sealable bell jar container comprising a base plate and a bell jar covering mountable on the base plate. An air-tight sealing mechanism is obtained by forming a laterally and downwardly opening annular groove in the base plate to support an O-ring gasket of rubber and providing, below the base plate, a presser plate which presses up the O-ring gasket against the base plate by a means of cams or screw means in such a fashion that the O-ring gasket is elastically deformed and laterally bulged out to be brought into air-tight contacting with the inner wall of the bell jar covering surrounding the base plate.

10 Claims, 8 Drawing Sheets

AIR-TIGHTLY SEALABLE CONTAINER WITH BELL JAR COVERING

This is a continuation-in-part application from a copending U.S. Pat. application Ser. No. 09/069,327 filed Apr. 29, 1998.

BACKGROUND OF THE INVENTION

The present invention relates to an air-tightly sealable container with a bell jar covering provided with a sealing mechanism between the bell jar covering and the base plate on which the bell jar covering is mounted to be used for storage and transportation of various precision products to be kept absolutely free from contamination with atmospheric dust particles such as semiconductor silicon wafers.

The routine delivery system of semiconductor silicon wafers is that the silicon wafers as produced in the plant of a wafer producer are packaged in a specially designed container for transportation and transported therein to the plant of a manufacturer of semiconductor devices such as integrated circuits. Similar containers are used also within the plant of the device manufacturers for the purpose of inhouse transfer of intermediate products from a line to a subsequent line for the next step of working.

Needless to say, a semiconductor silicon wafer is a product of extremely high purity and must be kept away from any trace contamination, on the base of which ultrafine and extremely delicate electronic circuits are to be built so that the container therefor must be provided with a very reliable sealing mechanism by means of which intrusion of any trace amount of particulate foreign matters such as dust particles can be completely prevented.

One of the most traditional and simple way to obtain an air-tight sealing condition of the opening in such a container is that a pressure-sensitive adhesive tape is attached along the seam line of the container body and the covering all around or an elastic gasket member is interposed between the open periphery of the container body and the periphery of the covering under an appropriate compression so as to eliminate any smallest interstices or gaps, otherwise through which intrusion of dust particles may take place, to ensure a hermetic sealing condition.

These conventional methods for sealing are each not free from difficult problems. For example, adhesion of the pressure-sensitive adhesive tape to the surface of the container is sometimes not perfect due to occurrence of creases or twists of the tape depending on the outer configuration of the container and the worker's skill so that the hermetic sealing condition by this means is not always very reliable unless an unduly long time is taken for the taping works if not to mention possible contamination of the outer surface of the container with the adhesive. In addition, such a taping work is hardly susceptible to automatization.

The sealing method by using a rubber gasket also requires a clamping mechanism by which the container body and the covering are engaged and fastened each to the other and an appropriate compressive force is applied to the elastic gasket member.

In the current trend toward full automation of various production lines, it is eagerly desired to develop an air-tight sealing mechanism of a container with a bell jar covering which can be operated by an automatic machine for closing and opening the container.

SUMMARY OF THE INVENTION

The present invention accordingly has an object to provide a novel air-tightly sealable container with a sealing mechanism of a simple structure between a cylindrical bell jar covering and the base plate, on which the bell jar covering is mounted, by means of which mechanism a very reliable hermetic sealing condition can be ensured and which mechanism can be operated by an automatic machine for closing and opening of the container.

Thus the air-tightly sealable bell jar container with a sealing mechanism according to the invention comprises:

(A) a cylindrical bell jar covering;
(B) a base plate having a laterally and downwardly opening groove therearound along the outer side periphery, the dimensions of the base plate being smaller than the inner dimensions of the bell jar covering;
(C) an elastic sealing member, such as an O-ring gasket of rubber, to fit the groove of the base plate;
(D) a presser plate positioned below the base plate and for moving up and down to press the elastic sealing member against the base plate in such a fashion that the elastic sealing member is elastically deformed and bulged out laterally to be brought into contact with the inner wall of the bell jar covering surrounding the base plate; and
(E) a mechanical means for pushing the presser plate against the base plate such as a mechanism of cams and threaded screws.

Needless to say, the above mentioned cylindrical bell jar covering as the part (A) need not have a circular cross section but the horizontal cross section thereof can be of a generally square or rectangular form provided that each corner is rounded having a sufficiently large radius of curvature so that the elastic sealing member as the part (C) can fit the groove around the base plate as the part (B).

DETAILED DESCRIPTION OF THE PREFERRED EMBODIMENTS

As is described above, the air-tightly sealable bell jar container according to the invention comprises, as the principal parts thereof: (A) a bell jar covering having, for example, a circular cross section and mountable on a base plate, (B) a circular base plate having a diameter smaller than the inner diameter of the bell jar covering and provided with an annular groove opening downwardly and laterally, (C) an elastic sealing member such as an O-ring gasket of a rubbery material to fit the annular groove in the base plate and (D) a presser plate which presses the elastic sealing member against the base plate by (E) a mechanism such as cams or threaded bolts and nuts to such an extent that the elastic sealing member is compressed and laterally bulged out to be brought into contact with the inner wall of the bell jar covering mounted on the base plate to give an air-tight sealing condition between the base plate and the inner wall of the bell jar covering.

Figure 5:
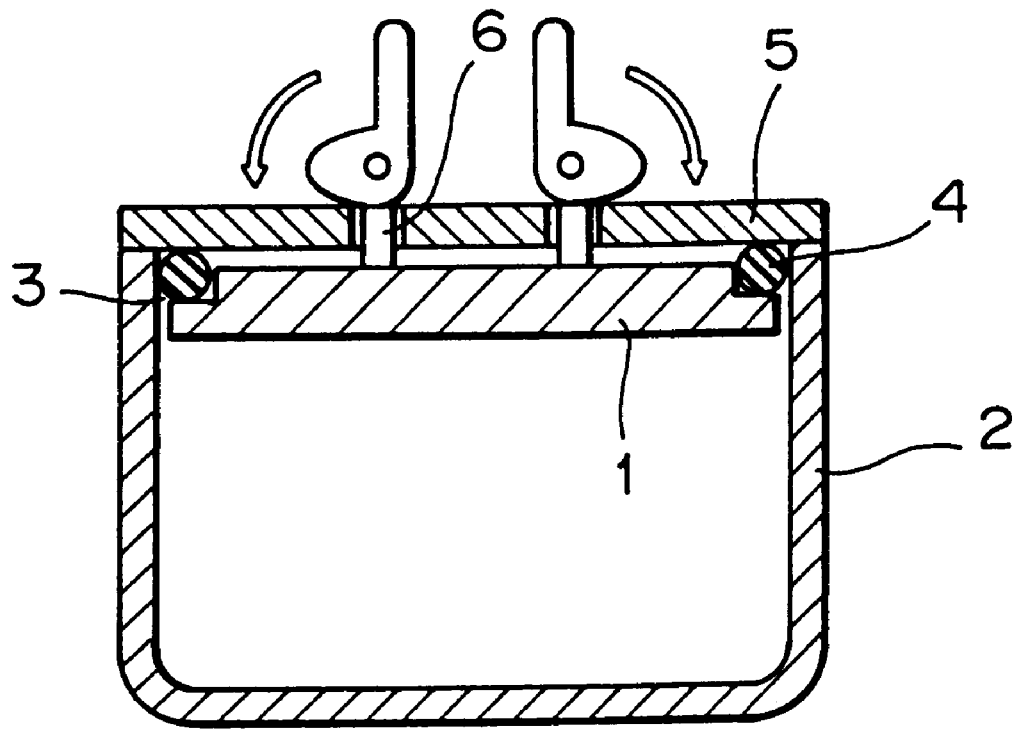
FIG. 5 is a vertical cross sectional view of the same container as shown in FIG. 4 on use in an upside-down disposition.

It is assumed in the above given description that the materials to be contained in the container are placed on the base plate and then the bell jar covering is mounted thereon although it is optional that the materials are placed on the bottom of the bell jar covering standing in an upside-down disposition and the assembly consisting of the base plate and the presser plate is mounted on the upward opening of the bell jar covering as is illustrated in FIG. 5.

In the following, the air-tightly sealable bell jar container of the invention is illustrated by making reference to the accompanying drawing. Although the following description is given by assuming that the bell jar covering has a circular cross section, about the same description is applicable even when the bell jar covering has a noncircular cross section such as a generally rectangular or square cross section with rounded corners.

Figure 1A:
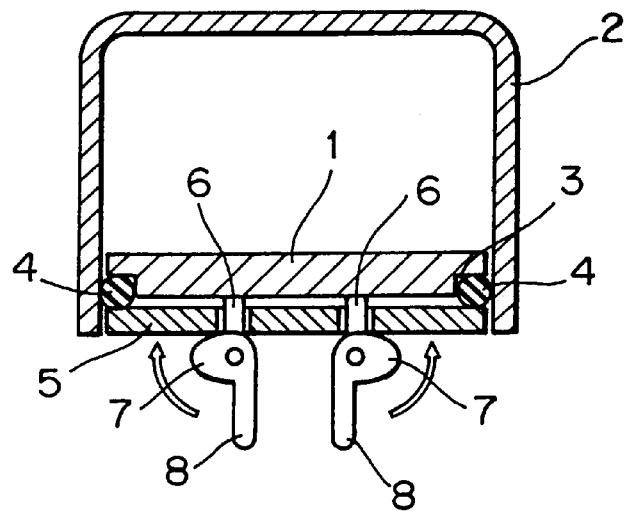
FIGS. 1A and 1B each illustrate the bell jar container of the invention by a vertical cross sectional view in an unsealed state and sealed state, respectively.
Figure 1B:
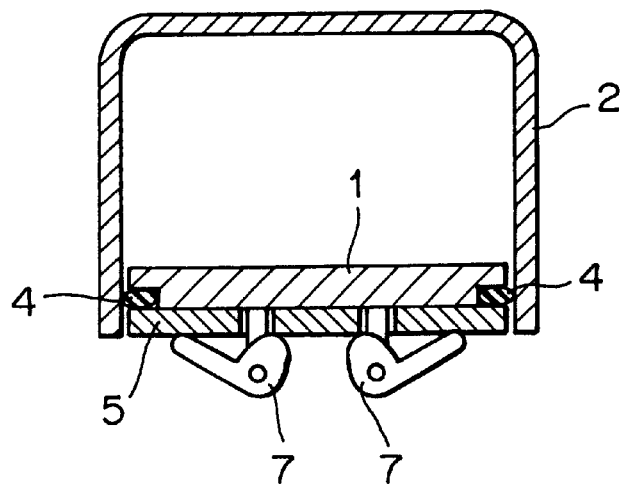

FIGS. 1A and 1B are each an axial cross sectional view of the inventive bell jar container in an open or unsealed state and sealed state, respectively. The container comprises a circular base plate 1, on which the materials to be contained are mounted, and a bell jar covering 2, of which the inner diameter is slightly larger than the diameter of the base plate 1, mountable on the base plate 1 in such a fashion that the base plate 1 is entirely enveloped inside of the bell jar covering 2 mounted thereon leaving a small clearance therebetween and a presser plate 5 below the base plate 1. The base plate 1 is provided with an annular groove 3 along the outer periphery thereof in such a fashion that the groove 3 is open laterally and downwardly. An O-ring gasket 4 of a rubber fits the annular groove 3 with elastic resilience. It is not always necessary in the open state of the container (FIG. 1A) that the O-ring gasket 4 is in contact with the inner wall of the bell jar covering 2. A presser plate 5 is provided below the base plate 1 in such a fashion that the presser plate 5 is movable up and down by sliding on the rods 6,6 downwardly extending from the lower surface of the base plate 1 to penetrate the presser plate 5 by operating the cams 7,7 pivotally supported on the rods 6,6 by means of the cam levers 8,8.

When the presser plate 5 is at the lowermost position as is illustrated in FIG. 1A, the container is in an open or unsealed state and the bell jar covering 2 can be freely removed from the base plate 1 by lifting. When the presser plate 5 is pushed up against the base plate 1 by turning the cams 7,7 in the direction indicated by the openwork arrows in FIG. 1A, as is illustrated in FIG. 1B, the O-ring gasket 4 in the annular groove 3 of the base plate 1 is upwardly compressed by the presser plate 5 against the upper wall of the annular groove 3 and is elastically deformed and bulged out laterally or radially to have an elliptic cross section and to be brought into contact with the inner wall of the bell jar covering 2 so that an air-tight sealing state is established between the base plate 1 and the inner wall of the bell jar covering 2.

In FIG. 1B, the base plate 1 and the presser plate 5 are fastened together by the mechanism of cams 7,7. When the fastening force is released by turning the cams 7,7, the presser plate 5 is pushed back by the elastic resilience of the O-ring gasket which regains the circular cross section as in FIG. 1A.

Figure 2A:
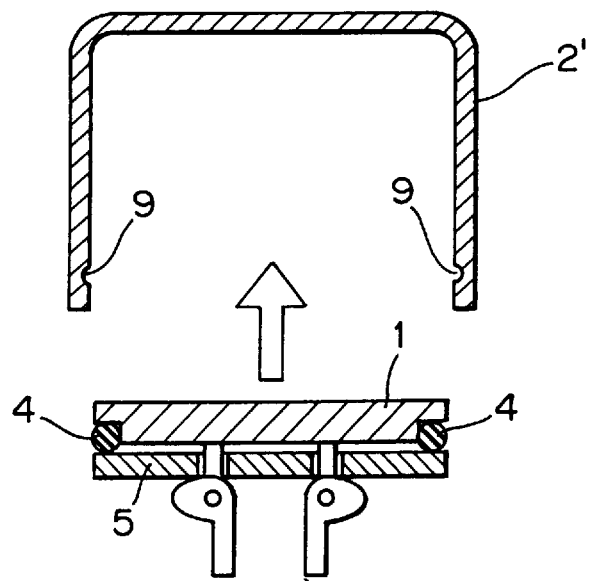
FIGS. 2A and 2B each illustrate the bell jar container of the invention in another embodiment by a vertical cross sectional view with the bell jar covering lifted above the base plate and mounted on the base plate to establish a sealed state, respectively.
Figure 2B:
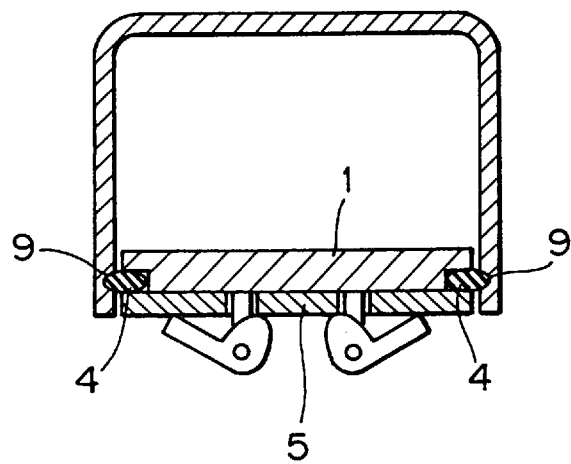

FIGS. 2A and 2B are for the illustration of the inventive container in an embodiment similar to that illustrated in FIGS. 1A and 1B.

While the bell jar covering 2 illustrated in FIGS. 1A and 1B has a smooth inner surface, the inner surface of the bell jar covering 2' in FIGS. 2A and 2B is not smoothly cylindrical but has an annular groove 9 around the lower portion of the bell jar covering 2'. When the bell jar covering 2' is mounted on the base plate 1 with an O-ring gasket 4 in the annular groove 3 of the base plate, the groove 9 on the inner wall of the bell jar covering 2' comes to the same height as the O-ring gasket 4 so that, when the presser plate 5 is pushed up against the base plate 1, the O-ring gasket 4 is upwardly compressed and laterally bulged out into the annular groove 9, as is illustrated in FIG. 2B, so that engagement between the base plate 1 and bell jar covering 2' can be improved so much as compared with the embodiment illustrated in FIGS. 1A and 1B.

Figure 3A:
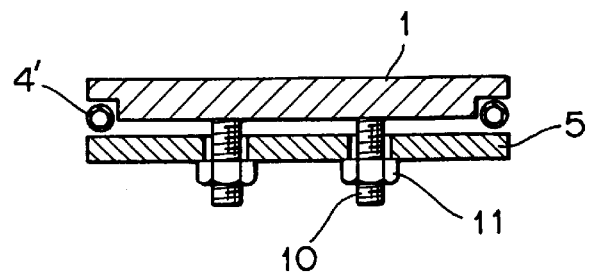
FIGS. 3A and 3B each illustrate the bell jar container (bell jar covering not shown) of the invention in a further different embodiment showing an assembly of the base plate and the pressing plate corresponding to an unsealed and sealed states, respectively, of the container by a vertical cross sectional view.
Figure 3B:
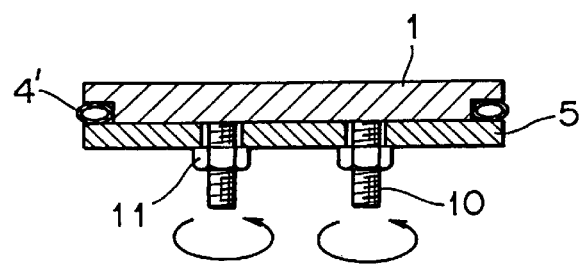

Although FIGS. 1A and 1B and FIGS. 2A and 2B show an O-ring gasket 4 which is solid, i.e. non-porous or not hollow, it is optional to use a hollow O-ring gasket 4' as is illustrated in FIGS. 3A and 3B provided that a reliable air-tight sealing condition can be obtained by the contact between the elastically deformed O-ring gasket 4' and the inner wall of the bell jar covering (not shown in FIGS. 3A and 3B).

FIGS. 3A and 3B further illustrate an alternative mechanical means for fastening the base plate 1 and the presser plate 5, in place of the mechanism of cams illustrated in FIGS. 1A and 1B and FIGS. 2A and 2B, consisting of screw bolts 10,10 implanted in and extending downwardly from the base plate 1 and screw nuts 11,11 movable up and down on the screw bolts 10,10. When the nuts 11,11 are at the lower positions, the O-ring gasket 4' is in an uncompressed state, as is illustrated in FIG. 3A, allowing free mounting and removing of the ball jar covering on and from the base plate 1 while, when the nuts are turned to push up the presser plate 5 against the base plate 1, as is illustrated in FIG. 3B, the O-ring gasket 4' is upwardly compressed and bulged out laterally to be brought into contact with the inner wall of the bell jar covering.

In the above described embodiments of the inventive bell jar container, the presser plate 5 is assumed to have a diameter approximately equal to the diameter of the base plate 1 which is slightly smaller than the inner diameter of the bell jar covering 2. It is, however, optional that the presser plate 5 has a diameter smaller or larger than the diameter of the base plate 1. In particular, as is illustrated in FIG. 4, the diameter of the presser plate 5' can be larger than the inner diameter of the bell jar covering 2 so that the bell jar covering 2 can rest at the lower periphery thereof on the presser plate 5'.

Figure 4:
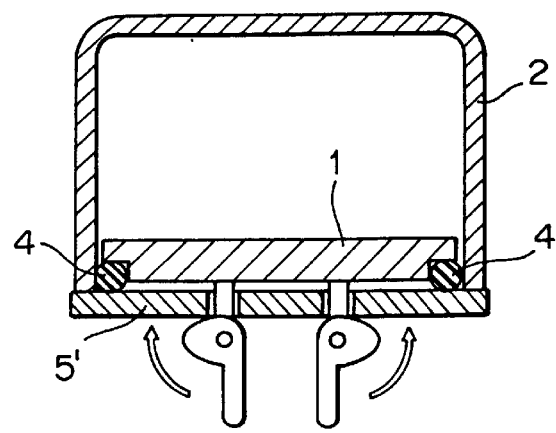
FIG. 4 is a vertical cross sectional view of a still different embodiment of the inventive container.

The embodiment of the inventive container illustrated in FIG. 4, in which the presser plate 5' has a diameter larger than the inner diameter of the bell jar covering 2, can be used as being turned upside-down so that, while, in the other embodiments described earlier, the materials to be contained in the container are placed on the base plate 1 and then the bell jar covering 2 is mounted thereon, the materials are first placed on the bottom of the bell jar covering 2 in an upside-down disposition and then the assembly of the base plate 1 and the presser plate 5 is mounted on the upper open periphery of the covering 2 without a trouble of falling down into the bell jar covering 2.

As is illustrated in FIG. 5, the bell jar container of the invention shown, for example, in FIG. 4 can be used in an upside-down disposition. In this case, the bell jar covering 2 in FIG. 4 is now the container bottom 2 in FIG. 5 standing on the flat bottom and the presser plate 5 now serves as the covering. The material contained in the container naturally rests on the bottom of the container body 2. Though not illustrated by way of figures, it is also optional that the bell jar covering container of the invention is used in such a disposition that the opening of the bell jar covering 2 or, namely, the assembly of the base plate 1 and the presser plate 5 facing in a horizontal direction.

Figure 6A:
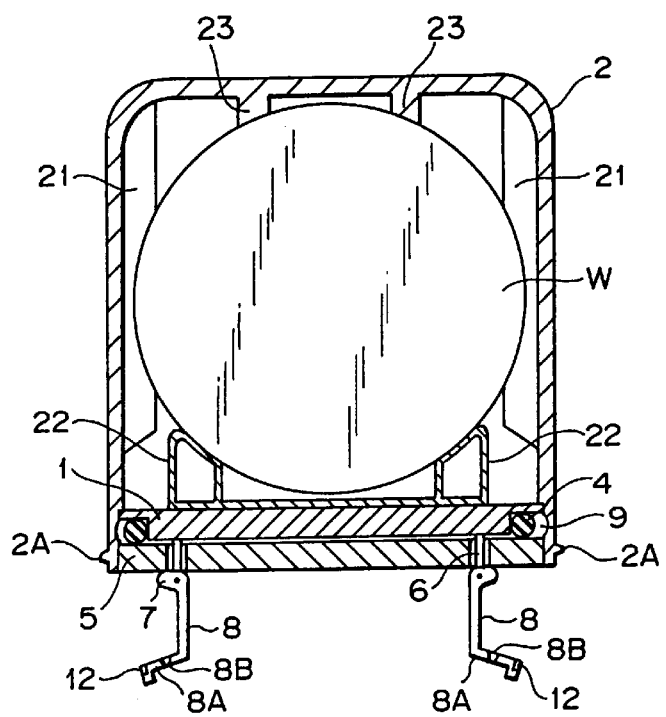
FIGS. 6A and 6B are each a vertical cross sectional view of the inventive bell jar container (wafer materials under holding added) in an unsealed state and sealed state, respectively, in which the cam levers are each secured in the sealing position by an engagement means with the bell jar covering.
Figure 6B:
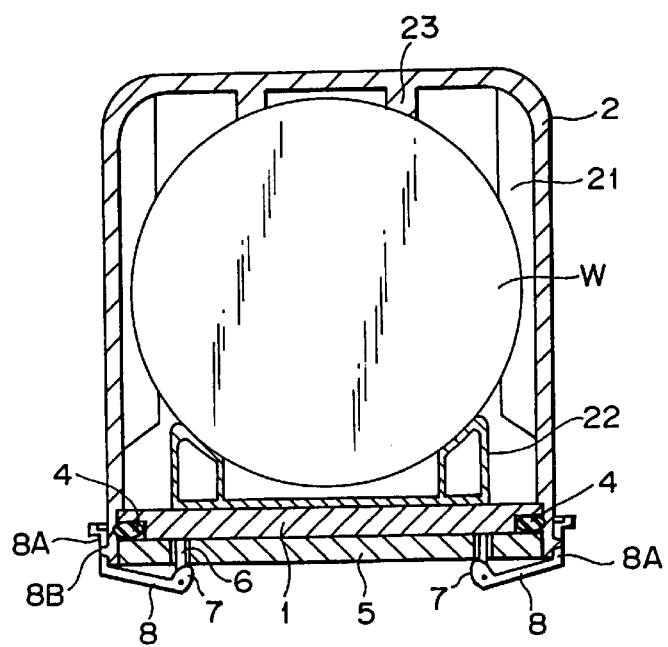

The bell jar container illustrated in FIGS. 6A and 6B each by a vertical cross sectional view is designed specifically as a container of semiconductor silicon wafers W so that the bell jar covering 2 has preferably a generally rectangular cross section and the container can be used in a disposition with the base plate 1 facing horizontally or upwardly, if desired. The bell jar covering 2 is integrally provided, on each of the oppositely facing inner walls thereof, a plurality of wafer-holding pleats 21 making wafer-alignment grooves, into which each of the wafer materials W is inserted at the peripheries thereof, with a regular pitch. Further, the bell jar covering 2 is integrally provided on the bottom wall with at least one or, preferably, a pair of rear wafer-retainer ribs 23 and the base plate 1 is provided on the surface facing the bell jar covering 2 with at least one or, preferably, a pair of front wafer-retainer ribs 22 having a hollow structure to exhibit cushioning resilience so that, when the wafer materials W are inserted into the wafer alignment grooves and the base plate 1 is mounted onto the opening of the bell jar covering 2, the wafer materials W can be secured at the respective positions safely with cushioning resilience between the front wafer-retainer ribs 22 and the rear wafer-retainer ribs 23.

Figure 6C:
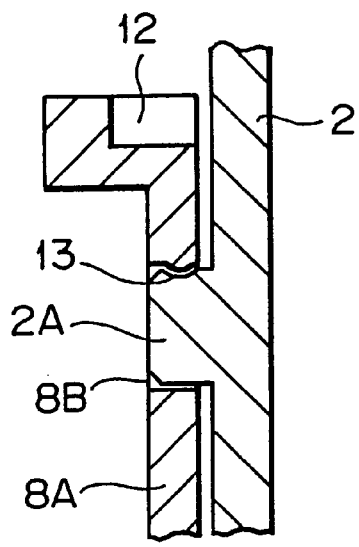
FIG. 6C is an enlarged vertical cross sectional view of a locking means of the cam lever to the outer surface of the bell jar covering.

Further characteristically, the bell jar container illustrated in FIGS. 6A and 6B is provided by a locking means for securing the levers 8 of the cams 7 at a sealing position to effect compressive deformation of the rubber gasket member 4. Namely, the cam lever 8 has a doglegged bent form with the cranked portion 8A having a recess or opening 8B. The outer wall of the bell jar covering 2 is provided with stud protrusions or rib protrusions 2A at positions coming into engagement with the opening or recess 8B in the cranked portion 8A of the cam lever 8, as is illustrated in FIG. 6C by an enlarged vertical cross sectional view, when the cam lever 8 is turned so as to cause compressive deformation of the rubber O-ring gasket 4 by pushing up the presser plate 5 by the cams 7 toward the base plate 1. By this locking means of the cam levers 8, the engagement between the base plate 1 and the bell jar covering 2 can be more reliable to be freed from inadvertent disengagement as is sometimes the case in the transportation of wafer-containing containers as an air cargo where the pressure outside the container is lower than the pressure inside of the container. Though optional, it is advantageous that a bump 13 on the surface of the opening 8B in the cam lever 8 to face the stad protrusion 2A so as to increase security of locking of the cam lever 8.

Figure 7:
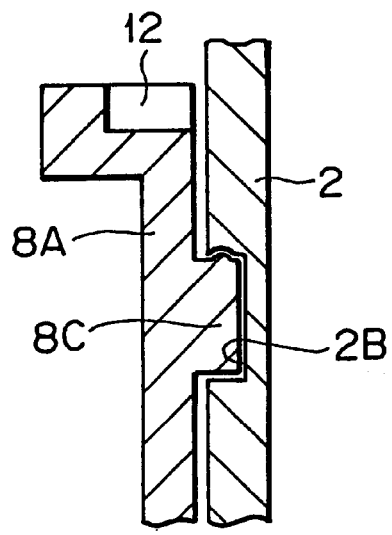
FIG. 7 is an enlarged vertical cross sectional view of an alternative locking means of the cam lever to the outer surface of the bell jar covering.

As is illustrated in FIG. 7 by an enlarged vertical cross sectional view, an alternative way of the locking means is that, instead of providing the cam lever 8 with an opening or recess 8B and the outer surface of the bell jar covering 2 with a stud protrusion or rib raise 2A, the cam lever 8 is provided with a stud protrusion 8C and the outer surface of the bell jar covering 2 is provided with a recess 2B so that the protrusion 8C comes into engagement with the recess 2B when the cam lever 8 is in the clamping position.

Figure 8:
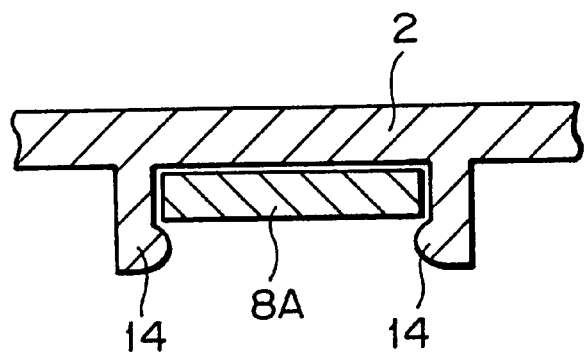
FIG. 8 is an enlarged horizontal cross sectional view of a further alternative locking means of the cam lever to the outer surface of the bell jar covering.

Further alternatively, as is illustrated in FIG. 8 by an enlarged horizontal cross sectional view, the locking means can be obtained by providing a pair of vertically running rib protrusions 14,14 on the lower portion of the outer surface of the bell jar covering 2 with an appropriate distance between two rib protrusions 14,14 so that the cranked end portion 8A of the cam lever 8 can be secured between the two rib protrusions 14,14 when in the sealing position of the cam 7.

In addition, as is illustrated in FIGS. 6A, 6B and 6C, the cam lever 8 is provided at the very end of the cranked portion 8A with a notch (or protrusion) 12 which serves as a means at which the working hand of an automatic loading-unloading machine (not shown in the figures) comes into engagement with the cam lever 8 so as to unnecessitate manual handling of the bell jar container.

Figure 9A:
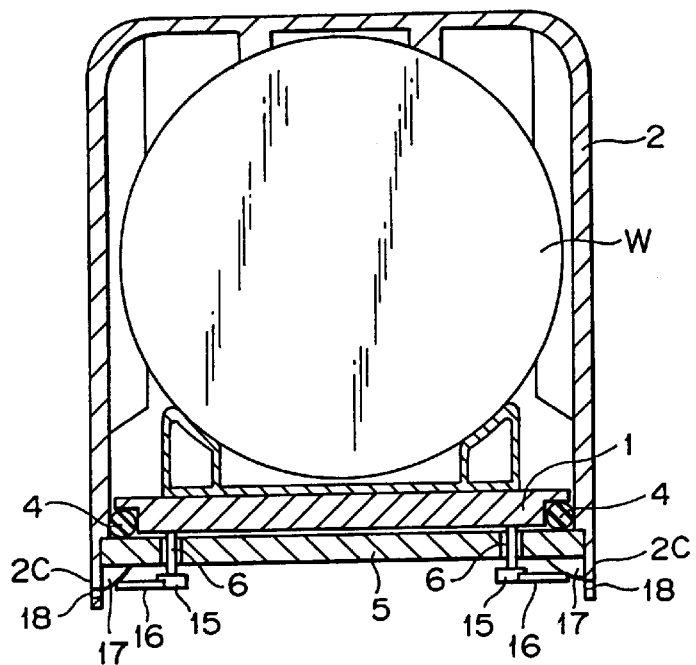
FIGS. 9A and 9B are each a vertical cross sectional view of an embodiment of the inventive bell jar container having horizontally turnable sealing levers in their unsealing and sealing positions, respectively.
Figure 9B:
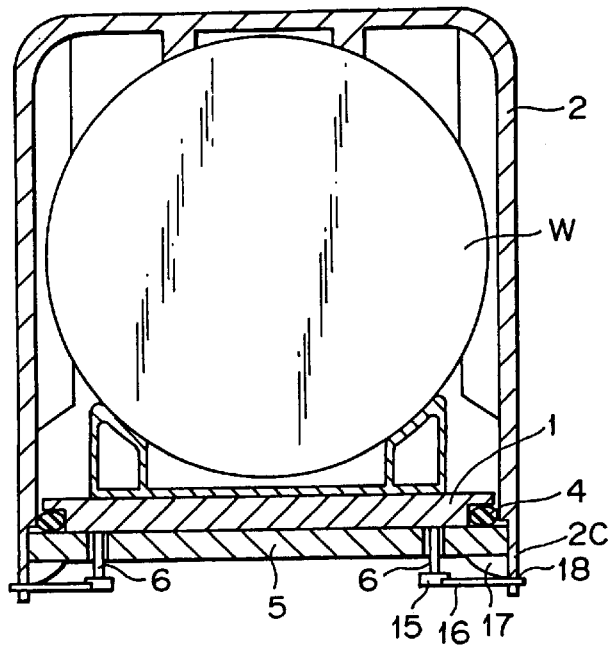
Figure 9C:
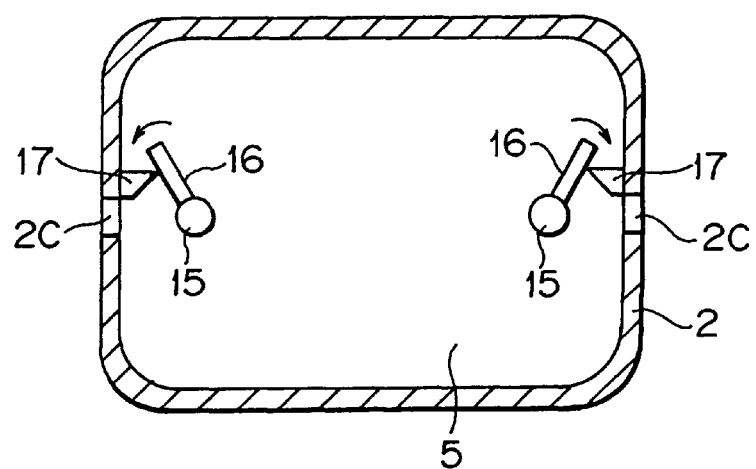
FIG. 9C is a bottom view of the bell jar container illustrated in FIGS. 9A and 9B with the sealing levers in their unsealing positions.
Figure 9D:
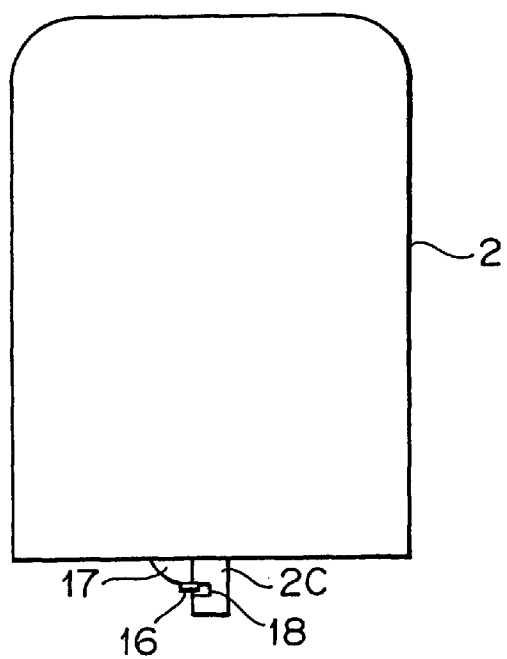
FIG. 9D is a side elevation view of the same bell jar container with the sealing levers in their sealing positions and engaged with the lever-hooking notches.

FIGS. 9A to 9D illustrate a further different embodiment of the inventive bell jar container in which air-tight sealing of the container is effected not by a mechanism of cams but by means of a mechanism of a pair of horizontally turnable levers 16 sliding along and in contact with sloped guide members 17, of which FIG. 9A is a vertical cross sectional view of the bell jar container with the turnable sealing levers 16 in their unsealing positions, FIG. 9B is the same vertical cross sectional view but with the turnable sealing levers in their respective sealing positions, FIG. 9C is a bottom view of the container with the turnable sealing levers 16 in their unsealing positions off the sloped guide members and FIG. 9D is a side elevation view of the bell jar container with the turnable sealing levers 16 in their sealing positions as engaged with the lever-hooking notches.

As is illustrated in FIG. 9A, the base plate 1 has a pair of rod members 6,6 each extending downwardly from the lower surface of the base plate 1 to penetrate the presser plate 5. A pivotally rotatable hub 15 is provided on the lower end of each rod member 6 and a lever 16 is connected to the hub 15 so that the lever 16 is turnable around the rod member 6 as the axis of rotation within a horizontal plane.

On the other hand, the presser plate 5 is provided on the lower surface thereof with a pair of sloped guide members 17,17. When the horizontally turnable sealing lever 16 is in the unsealing position, the lever 16 can be off the sloped guide member 17 as is shown in FIG. 9C and a gap space is formed between the lower surface of the base plate 1 and the upper surface of the presser plate 5. Namely, the presser plate is at the lowered position so that the rubber O-ring gasket 4 remains uncompressed and the base plate 1 and the bell jar covering 2 are not in an air-tight contacting condition.

When the horizontally turnable sealing lever 16 is turned in the direction shown by the arrows in FIG. 9C, the lever 16 moves along and sliding in contact with the sloped guide member 17 toward the part of larger thickness of the member 17 as is shown in FIG. 9B so that the distance between the lower surface of the presser plate 5 and the lever 16 or hub 15 is increased and consequently the distance between the lower surface of the base plate 1 and the upper surface of the presser plate 5 is decreased resulting in compressive deformation of the rubber O-ring gasket 4 to establish an air-tight sealing condition with the inner wall of the bell jar covering 2.

The sealing lever 16 in the sealing position (FIGS. 9B and 9D) can be secured and locked at the position by engagement with the lever-hooking notch 18 formed in the downward extension 2C of the bell jar covering 2 so that inadvertent or spontaneous unlocking of the sealing state can be prevented.

What is claimed is:

1. An air-tightly sealable bell jar container for holding a plurality of wafer materials which comprises:
   (A) a bell jar covering having a generally rectangular cross section;
   (B) a base plate having a laterally and downwardly opening groove along the outer side periphery, the dimensions of the base plate being smaller than the inner dimensions of the bell jar covering at the lower end thereof;
   (C) an O-ring gasket member to fit the groove of the base plate;
   (D) a presser plate positioned below the base plate and for moving up and down to press the O-ring gasket member against the base plate in such a fashion that the O-ring gasket member is elastically deformed and bulged out laterally to be brought into contact with the inner wall of the bell jar covering surrounding the base plate; and
   (E) a cam mechanism pivotally connected to a rod extending from the lower surface of the base plate to penetrate the presser plate for pushing the presser plate against the base plate as being rotated by a cam lever,
the bell jar covering being provided on each of the two oppositely facing side inner walls with a plurality of parallel wafer-holding pleats to make wafer-receiving grooves at a regular pitch for alignment of wafer materials.

2. The air-tightly sealable bell jar container for holding a plurality of wafer materials as claimed in claim 1 in which the bell jar covering is provided on the bottom surface with at least one rear wafer-retainer protrusion and the base plate is provided on the surface facing the bell jar covering with at least one front wafer-retainer protrusion so as to secure wafer materials inserted into the wafer alignment grooves between the rear and front wafer-retainer protrusions.

3. The air-tightly sealable bell jar container for holding a plurality of wafer materials as claimed in claim 2 in which the front wafer-retainer protrusion has a hollow structure to exhibit cushioning resilience to the wafer materials in contact therewith.

4. The air-tightly sealable bell jar container for holding a plurality of wafer materials as claimed in claim 2 in which the bell jar covering is provided on the bottom surface with a pair of rear wafer-retainer protrusions and the base plate is provided on the surface facing the bell jar covering with a pair of front wafer-retainer protrusions so as to secure wafer materials inserted into the wafer alignment grooves between the rear and front wafer-retainer protrusions.

5. The air-tightly sealable bell jar container for holding a plurality of wafer materials as claimed in claim 1 which the cam lever and the outer surface of the bell jar covering are provided with a locking means whereby the cam lever is secured to the outer surface of the bell jar covering when the cam is in a sealing position to compress the O-ring gasket member, the cam lever having a cranked configuration with a cranked end portion which comes into contact with the outer surface of the bell jar covering.

6. The air-tightly sealable bell jar container for holding a plurality of wafer materials as claimed in claim 5 in which the locking means to secure the cam lever to the outer surface of the bell jar covering comprises an opening or recess provided in the cam lever at the cranked end portion and a protrusion provided on the outer surface of the bell jar covering which comes into engagement with the opening or recess in the cam lever when the cam lever is in a sealing position.

7. The air-tightly sealable bell jar container for holding a plurality of wafer materials as claimed in claim 5 in which the locking means to secure the cam lever to the outer surface of the bell jar covering comprises a recess on the outer surface of the bell jar covering and a protrusion provided in the cranked end portion of the cam lever which comes into engagement with the recess in the outer surface of the bell jar covering when the cam lever is in a sealing position.

8. The air-tightly sealable bell jar container for holding a plurality of wafer materials as claimed in claim 5 in which the locking means to secure the cam lever to the outer surface of the bell jar covering comprises a pair of vertically running parallel rib protrusions on the outer surface of the bell jar covering at such a distance therebetween that, when the cam lever is in a sealing position, the cranked end portion of the cam lever fits and is secured between the rib protrusions.

9. An air-tightly sealable bell jar container for holding a plurality of wafer materials which comprises:
   (A) a bell jar covering having a generally rectangular cross section and provided on each of the two oppositely facing side inner walls with a plurality of parallel wafer-holding pleats to make wafer-receiving grooves at a regular pitch for alignment of wafer materials;
   (B) a base plate having a laterally and downwardly opening groove along the outer side periphery, the dimensions of the base plate being smaller than the inner dimensions of the bell jar covering at the lower end thereof;
   (C) an O-ring gasket member to fit the groove of the base plate;
   (D) a presser plate positioned below the base plate and for moving up and down to press the O-ring gasket member against the base plate in such a fashion that the O-ring gasket member is elastically deformed and bulged out laterally to be brought into contact with the inner wall of the bell jar covering surrounding the base plate; and
   (E) a sealing and unsealing mechanism comprising at least one member extending downwardly from the lower surface of the base plate to penetrate the presser plate, a pivotally rotatable hub on the lower end of the rod member, a lever connected to the hub so as to be turnable around the rod member as the axis of rotation and a sloped guide member, in contact with which the lever is turned in such a fashion that the lever is turned in contact with and sliding on the surface of the sloped guide member from a point of the guide member with a small thickness, when the container is in an unsealed state, to a point of the guide member with an increased thickness, to bring the container into a sealed state by increasing the distance between the lever and the lower surface of the presser plate.

10. The air-tightly sealable bell jar container for holding a plurality of wafer materials as claimed in claim 9 in which the bell jar covering has an extension downwardly extending from the open periphery having a notch to which the turnable sealing lever is engageable when the lever is in the sealing position.

* * * * *